US011114483B2

(12) United States Patent
Yeh et al.

(10) Patent No.: US 11,114,483 B2
(45) Date of Patent: Sep. 7, 2021

(54) CAVITYLESS CHIP-SCALE IMAGE-SENSOR PACKAGE

(71) Applicant: OmniVision Technologies, Inc., Santa Clara, CA (US)

(72) Inventors: Chien-Chan Yeh, Hemei Township (TW); Ying-Chih Kuo, Hsinchu (TW); Wei-Feng Lin, Hsinchu (TW); Chun-Sheng Fan, Hsinchu (TW)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/100,835

(22) Filed: Aug. 10, 2018

(65) Prior Publication Data

US 2020/0052019 A1   Feb. 13, 2020

(51) Int. Cl.
  *H01L 27/146*   (2006.01)
  *G02F 1/133*   (2006.01)
  *G02F 1/1335*   (2006.01)

(52) U.S. Cl.
  CPC .... *H01L 27/14618* (2013.01); *H01L 27/1462* (2013.01); *H01L 27/14627* (2013.01);
  (Continued)

(58) Field of Classification Search
  CPC ........... H01L 27/14618; H01L 27/1462; H01L 27/14627; H01L 27/14643;
  (Continued)

(56) References Cited

U.S. PATENT DOCUMENTS 5,715,022 A * 2/1998 Takamatsu ........ G02F 1/133526
                                                348/759
5,844,289 A * 12/1998 Teranishi .......... H01L 27/14609
                                                257/432

(Continued)

FOREIGN PATENT DOCUMENTS

JP   2011243749 A   * 12/2011
TW   201106471 A     2/2011

(Continued)

OTHER PUBLICATIONS

Wicht et al. (2010) "Nanoporous Films with Low Refractive Index for Large-Surface Broad-Band Anti-Reflection Coatings." Macromol. Mater. Eng., vol. 295, 9 pp.

(Continued)

*Primary Examiner* — Ida M Soward
(74) *Attorney, Agent, or Firm* — Lathrop GPM LLP

(57) ABSTRACT

A cavityless chip-scale image-sensor package includes a substrate, a microlens array, and a low-index layer. The substrate includes a plurality of pixels forming a pixel array. The microlens array includes a plurality of microlenses each (i) having a lens refractive index, (ii) being aligned to a respective one of the plurality of pixels and (iii) having a non-planar microlens surfaces facing away from the respective one of the plurality of pixels. The low-index layer has a first refractive index less than the lens refractive index. The low-index layer also includes a bottom surface, at least part of which is conformal to each non-planar microlens surface. The microlens array is between the pixel array and the low-index layer.

16 Claims, 5 Drawing Sheets

(52) U.S. Cl.
CPC .. *H01L 27/14643* (2013.01); *H01L 27/14685* (2013.01); *H01L 27/14689* (2013.01); *G02F 1/133526* (2013.01)

(58) Field of Classification Search
CPC ......... H01L 27/14685; H01L 27/14689; G02F 1/133526
See application file for complete search history.

(56) References Cited

U.S. PATENT DOCUMENTS

| | | | | |
|---|---|---|---|---|
| 5,990,992 | A * | 11/1999 | Hamanaka | G02B 3/0031 349/158 |
| 6,040,591 | A * | 3/2000 | Otsuka | H01L 27/1462 257/232 |
| 6,221,687 | B1 * | 4/2001 | Abramovich | H01L 27/14601 438/69 |
| 6,583,438 | B1 * | 6/2003 | Uchida | G02B 3/0012 257/291 |
| 6,586,811 | B2 * | 7/2003 | Sekine | H01L 27/14621 257/432 |
| 6,974,717 | B2 * | 12/2005 | Izumi | H01L 27/1462 438/57 |
| 6,985,297 | B2 * | 1/2006 | Yamanaka | G02B 3/0031 359/619 |
| 7,561,336 | B2 * | 7/2009 | Osaka | H04N 5/7441 348/340 |
| 7,767,485 | B2 * | 8/2010 | Ogawa | H01L 27/14618 257/E21.536 |
| 8,038,822 | B2 * | 10/2011 | Kindler | H04N 9/3129 156/245 |
| 8,330,840 | B2 * | 12/2012 | Lenchenkov | H01L 31/02165 348/294 |
| 8,355,072 | B2 * | 1/2013 | Ogino | G02B 1/11 257/294 |
| 8,872,293 | B2 * | 10/2014 | Takachi | G02B 5/282 257/432 |
| 8,896,079 | B2 * | 11/2014 | Uekawa | H01L 27/14625 257/432 |
| 9,461,083 | B2 * | 10/2016 | Takahashi | H01L 27/14623 |
| 9,657,182 | B2 * | 5/2017 | Ezoe | C09D 201/00 |
| 9,793,309 | B2 | 10/2017 | Seo et al. | |
| 9,868,884 | B2 * | 1/2018 | Ikeda | C08F 220/18 |
| 9,991,301 | B2 * | 6/2018 | Yamamoto | H01L 27/1462 |
| 10,038,021 | B2 * | 7/2018 | Yamamoto | H01L 27/14618 |
| 10,088,293 | B2 * | 10/2018 | Nishiwaki | G01J 1/0407 |
| 10,747,982 | B2 * | 8/2020 | Popovich | G02B 5/1828 |
| 2007/0126914 | A1 * | 6/2007 | Komatsu | H01L 27/14627 348/340 |
| 2009/0073559 | A1 * | 3/2009 | Woodgate | G02B 30/27 359/465 |
| 2011/0156192 | A1 * | 6/2011 | Higuchi | H01L 27/14625 257/434 |
| 2012/0112223 | A1 | 5/2012 | Kuo | |
| 2013/0032914 | A1 * | 2/2013 | Iwasaki | H01L 27/14621 257/432 |
| 2016/0133762 | A1 * | 5/2016 | Blasco Claret | H01L 31/02327 257/432 |
| 2016/0260760 | A1 | 9/2016 | Fan et al. | |
| 2017/0355637 | A1 * | 12/2017 | Nomura | C03B 17/067 |
| 2018/0019277 | A1 * | 1/2018 | Nagata | H01L 27/14634 |
| 2018/0114805 | A1 * | 4/2018 | Takiguchi | H01L 27/1462 |
| 2018/0215842 | A1 * | 8/2018 | Katou | G02B 7/025 |
| 2019/0109161 | A1 * | 4/2019 | Goto | H04N 9/04511 |

FOREIGN PATENT DOCUMENTS

| | | |
|---|---|---|
| TW | M520771 U | 4/2016 |
| TW | 201802602 A | 1/2018 |

OTHER PUBLICATIONS

Xi et al. (Mar. 2007) "Optical thin-film materials with low refractive index for broadband elimination of Fresnel reflection." Nature Photonics, vol. 1, 4 pp.

Taiwan Patent Application No. 108124344 Office Action dated Jan. 15, 2020, with English translation, 12 pages.

Taiwan Patent Application No. 108124344 Office Action dated Jul. 17, 2020, with English translation, 14 pages.

* cited by examiner

CAVITYLESS CHIP-SCALE IMAGE-SENSOR PACKAGE

BACKGROUND

The present invention relates to image sensors, and specifically, the encapsulation of a pixel array of an image sensor.

Camera modules in products such as stand-alone digital cameras, mobile devices, automotive components, and medical devices often include a complementary metal-oxide-semiconductor (CMOS) image sensor. The CMOS image sensor converts light from a scene imaged by a camera lens into a digital signal that is converted into a displayed image and/or file containing the image data. The CMOS image sensor includes a pixel array and a corresponding microlens array, wherein each microlens focuses light on pixel includes a respective pixel. In many camera modules, the CMOS image sensor is part of a chip-scale package, which includes protective layers above the photosensitive area of the CMOS image sensor. Common problems with existing image sensors include layer delamination and image artifacts caused by light reflected from the protective layers.

SUMMARY OF THE EMBODIMENTS

In a first aspect, a cavityless chip-scale image-sensor package includes a substrate, a microlens array, and a low-index layer. The substrate includes a plurality of pixels forming a pixel array. The microlens array includes a plurality of microlenses each (i) having a lens refractive index, (ii) being aligned to a respective one of the plurality of pixels and (iii) having a non-planar microlens surface facing away from the respective one of the plurality of pixels. The low-index layer has a first refractive index less than the lens refractive index. The low-index layer also includes a bottom surface, at least part of which is conformal to each non-planar microlens surface. The microlens array is between the pixel array and the low-index layer.

In a second aspect, a method for encapsulating an image sensor includes covering a pixel array of the image sensor with a low-index layer having a first refractive index. The image sensor includes a microlens array that includes a plurality of microlenses each (i) being aligned to a respective one of the plurality of pixels and (ii) having a non-planar microlens surface facing away from the respective one of the plurality of pixels. Covering the pixel array results in a bottom surface of the low-index layer being conformal to each non-planar microlens surface.

DETAILED DESCRIPTION OF THE EMBODIMENTS

Figure 1:
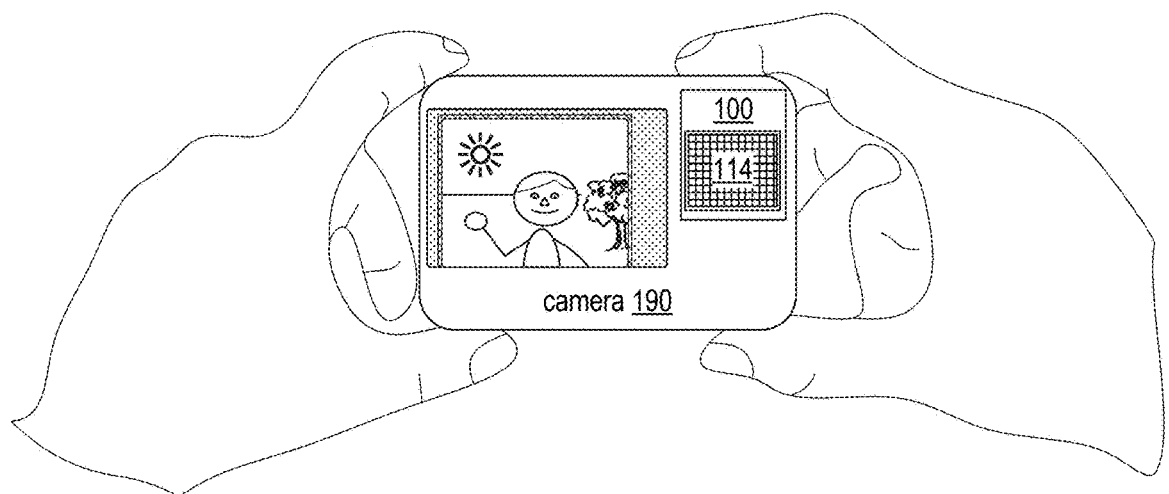
FIG. 1 depicts a camera that includes a chip-scale image sensor package.
Figure 2:
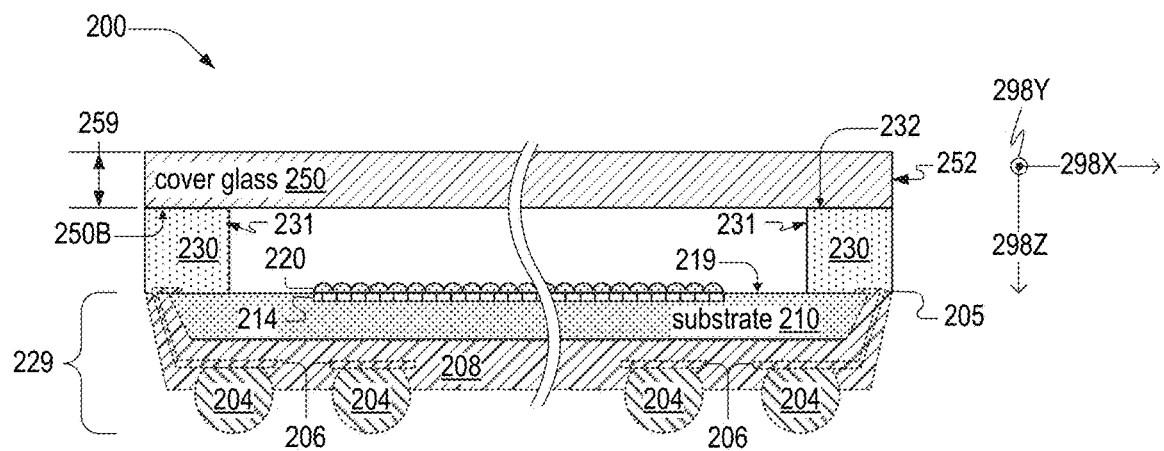
FIGS. 2 and 3 are, respectively, a cross-sectional schematic and a plan view of a chip-scale image sensor package.
Figure 3:
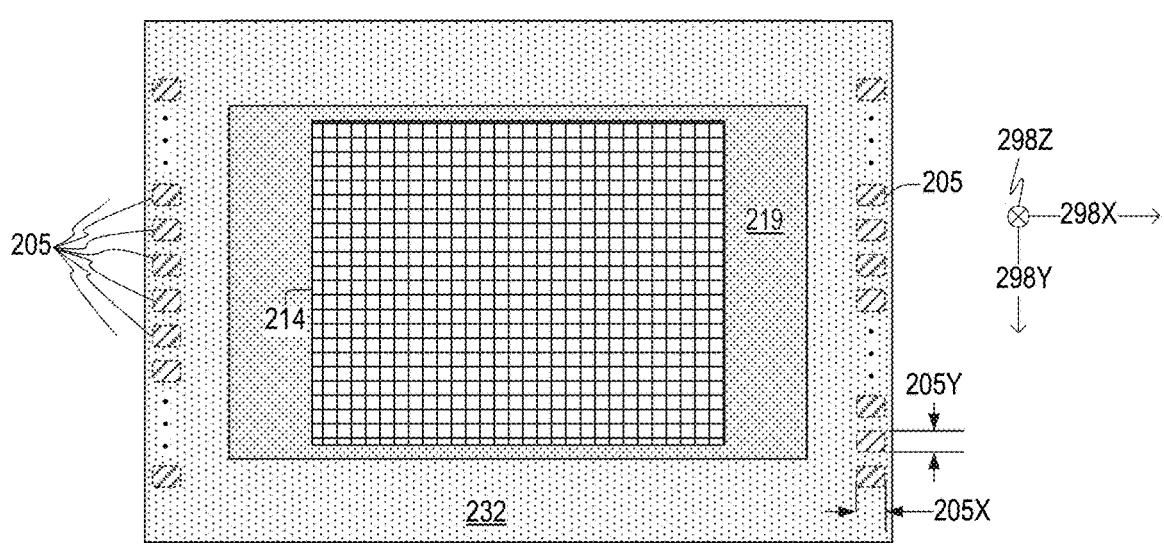

FIG. 1 depicts a camera 190 imaging a scene. Camera 190 includes a chip-scale image sensor package 100, which includes a pixel array 114. Hereinafter "CSP" denotes "chip-scale image-sensor package." FIG. 2 is a cross-sectional schematic of a CSP 200, which is an example of CSP 100 The cross-sectional schematic of FIG. 2 is parallel to a plane formed by orthogonal directions 298X and 298Z, which are each orthogonal to direction 298Y. FIG. 3 is a plan-view schematic of CSP 200. FIGS. 2 and 3 are best viewed together in the following description.

CSP 200 includes a device substrate 210, a spacer 230, and a cover glass 250.

For clarity of illustration, FIG. 3 does not show cover glass 250. Device substrate 210 includes pixel array 214, which is configured to detect light transmitted by cover glass 250. Pixel array 214 includes a plurality of pixels, and is an example of pixel array 114. CSP 200 may also include a microlens array 220. Microlens array 220 includes a plurality of microlenses each aligned to a respective one of the plurality of pixels of pixel array 214. Device substrate 210 may a semiconductor die, and may be formed of, or include, a semiconductor, such as silicon, germanium, or a combination thereof. Device substrate 210 has a top surface 219, which is perpendicular to direction 298Z.

Spacer 230 is on a top surface 219 of device substrate 210 and at least partially surrounds pixel array 214. Spacer 230 has an inner surface 231 and a top surface 232. Cover glass 250 is attached to top surface 232 and covers pixel array 214. CSP 100 may include an adhesive between at least one of (a) top surface 232 and bottom surface 250B and (b) top surface 232 and top surface 219.

CSP 200 may also include one or more bond pads 205, a redistribution layer 206, and a dielectric layer 208. Redistribution layer 206 electrically connects pixel array 214 to conductors 204. A single bond pad 205 has dimensions 205X and 205Y, which are each, for example, 100±20 µm. FIG. 2 designates a bare image sensor 229, which includes device substrate 210, pixel array 214, and microlens array 220. Bare image sensor 229 may also include one or more of redistribution layer 206, dielectric layer 208, conductors 204, and/or bond pads 205. Dielectric layer 208 may be formed of a solder-mask material, such as a polymer.

Cover glass 250 may be formed of aluminosilicate glass, alkali-free glass, borosilicate glass, quartz glass, or a combination thereof. Cover glass 250 has a thickness 259, which is between 0.20 millimeters and 0.50 millimeters, for example.

A disadvantage of CSP 200 is that light transmitted through cover glass 250 may reflect off of inner surface 231 toward microlens array 220, which results in an artifact in images captured by camera 190. A second disadvantage of CSP 200 is that spacer 230 is prone to delamination from either device substrate 210 and/or cover glass 250.

Figure 4:
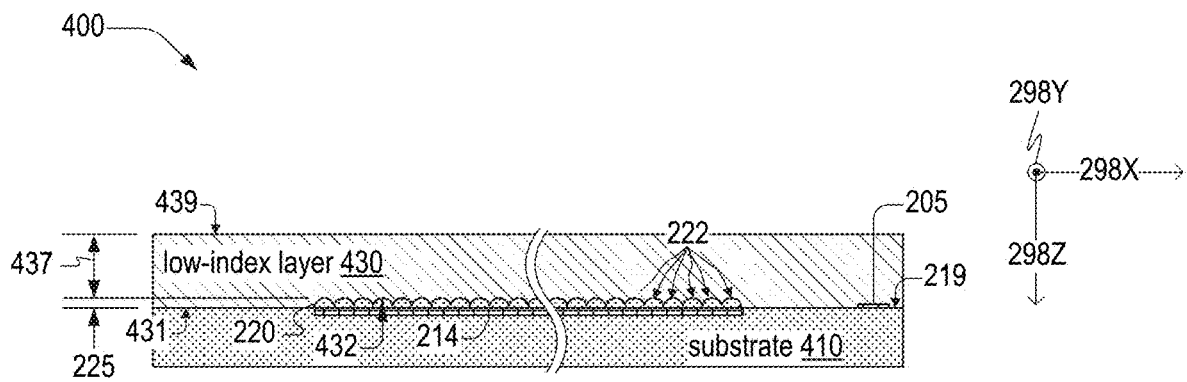
FIG. 4 is a cross-sectional schematic of a first cavityless chip-scale image-sensor package, in an embodiment.

FIG. 4 is a cross-sectional schematic of a cavityless CSP 400, which is an example of CSP 100 of camera 190, FIG. 1. Cavityless CSP 400 includes a device substrate 410 and a low-index layer 430. Device substrate 410 includes pixel array 214, which has microlens array 220 thereon. Microlens array 220 may be between device substrate 210 and low-index layer 430. Device substrate 410 is an example of device substrate 210.

Low-index layer 430 may serve the same protective function as cover glass 250, which is supported by spacer 230 in CSP 200. Since low-index layer 430 does not require spacer 230, low-index layer provides benefits of cover glass 250 without the aforementioned image artifacts and delamination issues.

Low-index layer 430 has a refractive index $n_3$ that is less than a refractive index $n_2$ of each microlens of microlens array 220. Microlens array 220 has a plurality of non-planar microlens surfaces 222 each corresponding to, e.g., aligned with, a respective one of the plurality of microlenses. Microlens surfaces 222 may form a single continuous non-planar top surface of microlens array 220. Microlens array 220 has a maximum height 225 above top surface 219. Maximum height 225 may correspond to the height of an apex, or local maximum, of one or more of non-planar microlens surfaces 222. Each microlens of microlens array 220 has a width (or diameter), in at least one of directions 298X and 298Y, between 0.8 micrometers and ten micrometers.

Low-index layer 430 has a bottom surface 431 and a top surface 439. Bottom surface 431 includes a surface region 432 that is conformal to microlens surfaces 222. As FIG. 4 illustrates, low-index layer 430 covers microlens array 220. Surface region 432 covers microlens array 220 and is conformal to microlens surfaces 222. Low-index layer 430 and/or surface region 432 may completely cover microlens array 220. For example, low-index layer 430 and/or surface region 432 covers each microlens surface 222 and regions between adjacent microlens surfaces 222. Part of bottom surface 431 may conform to, and may adjoin, top surface 219 of device substrate 410. Without departing from the scope hereof, surface region 432 may correspond to the entirety of bottom surface 431. Top surface 439 may be planar and may be parallel to top surface 219 of device substrate 210 to within manufacturing tolerances. Low-index layer 430 may cover one or more bond pads 205 of device substrate 410.

At a visible electromagnetic wavelength, refractive index $n_2$ of microlens array 220 may exceed refractive index $n_3$ of low-index layer 430 by at least $\Delta n = 0.2$. Lens refractive index $n_2$ may each be in a range of $1.50 \pm 0.04$ at a visible electromagnetic wavelength. Refractive index $n_3$ may be between 1.20 and 1.25 at a visible electromagnetic wavelength. Low-index layer 430 has a minimum thickness 437 between surface region 432 and top surface 439. Minimum thickness 437 may be in the range between 100 and 110 nm. The product of minimum thickness 437 and refractive index $n_3$ of low-index layer 430 may correspond to a quarter-wave optical thickness at a visible electromagnetic wavelength. The visible electromagnetic wavelength may be between 480 nanometers and 515 nanometers, or between 525 nanometers and 575 nanometers, for example. The aforementioned refractive index range and thickness range are advantageous for optimizing the amount of light incident on microlens array 220 that reaches pixel array 214.

Low-index layer 430 may be a nanoporous film or nanoporous layer, for example, formed of silicon dioxide or aluminum oxyhydroxide (AlO(OH)). When low-index layer 430 is a nanoporous layer, such as an aerogel, the layer may include pores that have a maximum width ("pore size") less than one hundred nanometers such that the pores do not scatter visible light. An average pore size (e.g., root-mean-square) may be between seven and fifteen nanometers, e.g., ten nanometers. Low-index layer 430 may be formed via oblique-angle deposition, a type of vapor-deposition process.

Figure 5:
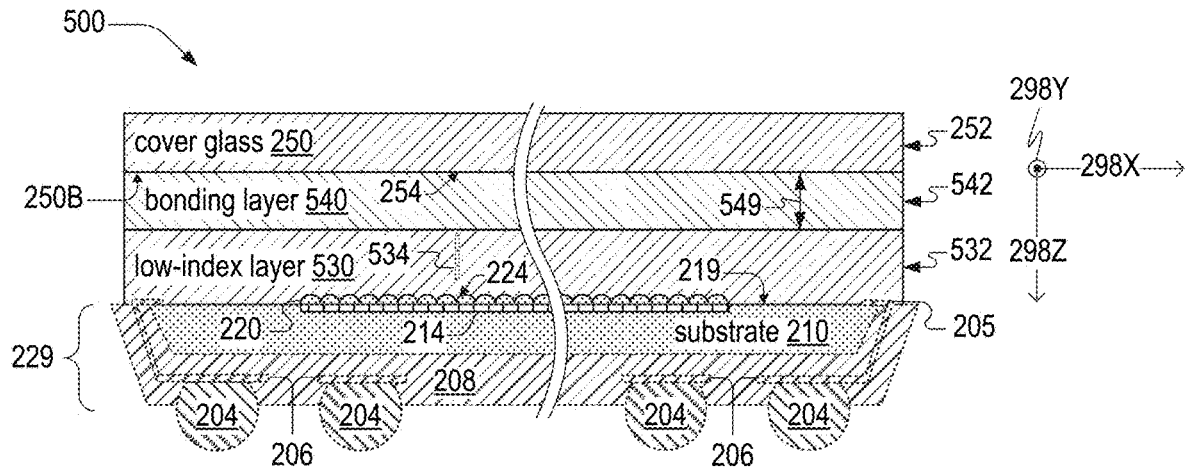
FIG. 5 is a cross-sectional schematic of a second cavityless chip-scale image-sensor package, in an embodiment.

FIG. 5 is a cross-sectional schematic of a cavityless CSP 500, which is an example of CSP 100 of camera 190, FIG. 1. Cavityless CSP 500 includes a low-index layer 530, a bonding layer 540, and cover glass 250 on bare image sensor 229. Low-index layer 530 is an example of low-index layer 430 and covers bond pad 205 of bare image sensor 229. In cavityless CSP 500, bond pad 205 is beneath at least one of low-index layer 530, bonding layer 540, and cover glass 250. Low-index layer 530 may be in direct contact with bond pad 205. Judicious choice of material for low-index layer 530, e.g., its refractive index, may also result in increased transmission of light reaching pixel array 214 compared to CSP 200.

Low-index layer 530 may completely cover microlens array 220. In an embodiment, low-index layer 530 covers each microlens surface 222 and regions between adjacent microlens surfaces 222. FIG. 5 denotes a surface region 254 of bottom surface 250B and a side surface 252 of cover glass 250. Surface region 254 is above a surface region 224 of microlens array 220. Surface region 224 may include: part of a single or multiple microlens surfaces 222, a surface between adjacent microlens surfaces 222, a surface adjacent to a microlens surface 222, or a combination thereof. Low-index layer 530 may completely cover microlens array 220 such that a volume element 534 of low-index layer 530 is directly between surface region 254 and surface region 224.

Bonding layer 540 and cover glass 250 have respective refractive indices $n_4$ and $n_5$, each of which may exceed refractive index $n_3$ of low-index layer 530. Refractive indices $n_4$ and $n_5$ may be approximately equal, for example, $|n_4 - n_5| < 0.08$, a benefit of which is to minimize reflections from bottom surface 250B. Bonding-layer refractive index $n_4$ and coverglass refractive index $n_5$ may each be in a range of $1.50 \pm 0.04$ at a visible electromagnetic wavelength.

Bonding layer 540 may be an epoxy, such as a two-component epoxy, and may be room-temperature curable. Bonding layer 540 may have physical properties amenable to imparting minimal stress on cover glass 250 and low-index layer 530. For example, bonding layer 540 may have, in a temperature range $\Delta T_L$ below a glass transition temperature of the plurality of microlenses of microlens array 220, a coefficient of thermal expansion less than 200 ppm/K. The temperature range $\Delta T_L$ may have a lower bound greater than or equal to $-15°$ C. and may have an upper bound less than the glass transition temperature. The glass transition temperature is between 65° C. and 70° C., for example. In an embodiment, the coefficient of thermal expansion of bonding layer 540 is between 130 ppm/K and 150 ppm/K in temperature range $\Delta T_L$, and the elastic modulus is less than 350 mPa. In an embodiment, the coefficient of thermal expansion of bonding layer 540 is between 65 ppm/K and 75 ppm/K in temperature range $\Delta T_L$, and between 200 ppm/K and 220 ppm/K at a temperature range above the glass transition temperature.

Bonding layer 540 has a thickness 549 and a side surface 542. Decreasing thickness 549 yields improved optical performance, e.g., by minimizing absorption losses and flare from reflections from side surface 542. Yet, decreasing thickness 549 also decreases process yield. Applicant has determined that thickness 549 being between five micrometers and ten micrometers is a satisfactory tradeoff between performance and manufacturability.

Low-index layer 530 has a side surface 532. In an embodiment, dielectric layer 208 extends upward (in a direction opposite direction 298Z) to cover at least one of side surfaces 532, 542, and 252 of low-index layer 530, bonding layer 540, and cover glass 250, respectively.

Figure 6:
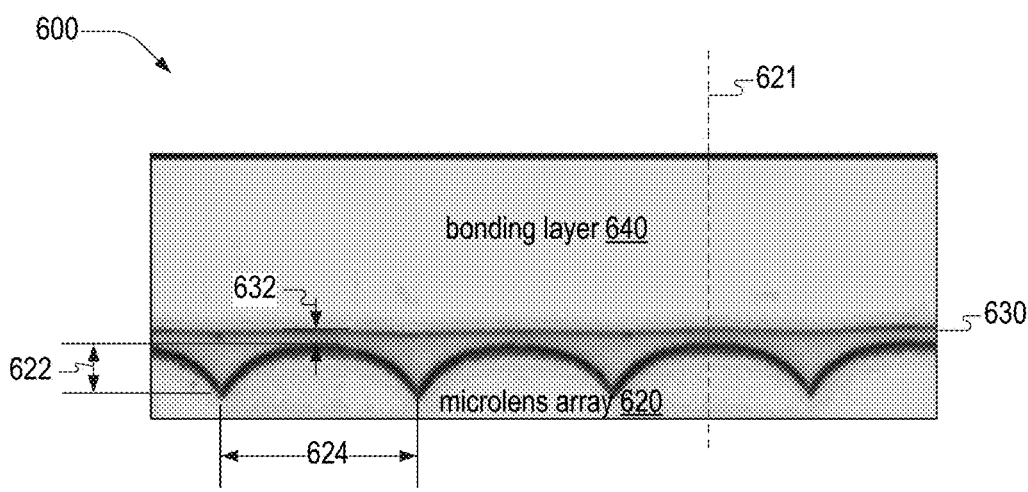
FIG. 6 is a scanning-electron microscope image of a third cavityless chip-scale image-sensor package, in an embodiment.

FIG. 6 is a scanning-electron microscope image 600 of a low-index layer 630 between a microlens array 620 and a bonding layer 640. Low-index layer 630 is an example of low-index layers 430 and 530. Bonding layer 640 is an example of bonding layer 540. Microlens array 620 is an example of microlens array 220.

Microlens array 620 includes a plurality of microlenses each having a respective microlens center at a maximum height above device substrate 210. For example, a plane 621 intersects at least one microlens center of microlens array 620. The following description of microlens array 620 and low-index layer 630 regards scanning-electron microscope image 600 as a cross-section of microlens array 620 through said microlens centers, such that a distance 624 is a microlens diameter. Microlens array has a peak-to-valley height 622. Low-index layer 630 has a thickness 632 above one or more microlens centers. Thickness 632 may be less than peak-to-valley height 622.

Figure 7:
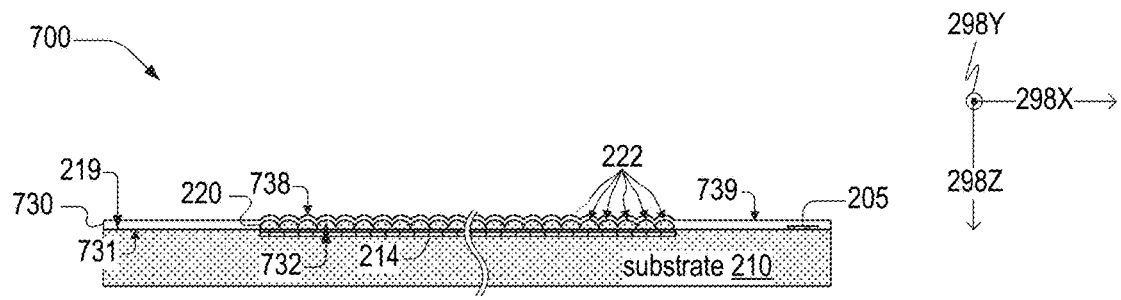
FIG. 7 is a cross-sectional schematic of a fourth cavityless chip-scale image-sensor package, in an embodiment.

FIG. 7 is a cross-sectional view of a cavityless CSP 700, which is an example of CSP 100 of camera 190, FIG. 1. Cavityless CSP 700 includes device substrate 410 and a low-index layer 730. Microlens array 220 may be between device substrate 210 and low-index layer 730.

Low-index layer 730 has refractive index $n_3$, described above regarding low-index layer 430, FIG. 4. Low-index layer 730 includes a bottom surface 731 and a top surface 739. Bottom surface 731 includes a surface region 732, above microlens surfaces 222, that is conformal to microlens surfaces 222. Top surface 739 includes a surface region 738, above both microlens surfaces 222 and surface region 732, that is conformal to surface region 732 therebeneath, and hence also is conformal to microlens surfaces 222. Surface regions 732 and 738 may each be directly above a plurality of microlens surfaces 222. Peaks and valleys of surface regions 738 may be aligned with respective peaks and valleys of surface region 732, which are aligned with respective peaks and valleys of microlens surfaces 222. Surface region 738 may have a peak-to-valley height that is less than a peak-to-valley height of surface region 732. The conformality of surface regions 732 and 738 to microlens surfaces 222 may enhance the anti-reflective properties of low-index layer 730 compared to low-index layer 430.

Low-index layer 730 may extend beyond microlens array 220 such that bottom surface 731 adjoins top surface 219 of device substrate 210. In such an embodiment, low-index layer 730 may cover one or more bond pads 205 of device substrate 210. Alternatively, surface regions 732 and 738 may correspond to the entirety of bottom surface 731 and top surface 739, respectively.

Figure 8:
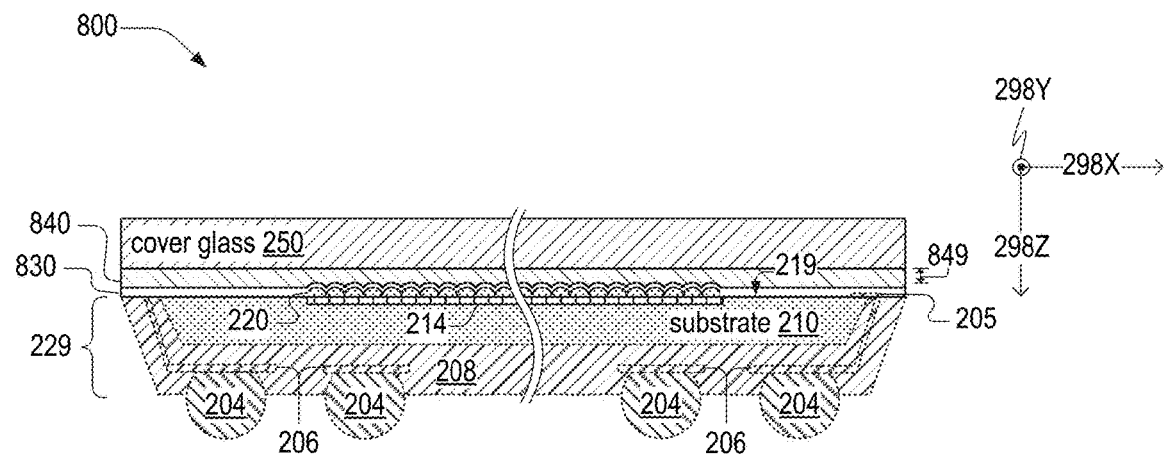
FIG. 8 is a cross-sectional schematic of a fifth cavityless chip-scale image-sensor package, in an embodiment.

FIG. 8 is a cross-sectional schematic of a cavityless CSP 800, which is an example of CSP 100 of camera 190, FIG. 1, cavityless CSP 800 includes a low-index layer 830, a bonding layer 840, and cover glass 250 on bare image sensor 229. Low-index layer 830 is an example of low-index layer 730 and covers bond pad 205 of bare image sensor 229. In cavityless CSP 800, bond pad 205 is beneath at least one of low-index layer 830, bonding layer 840, and cover glass 250. Low-index layer 830 may be in direct contact with bond pad 205. Bonding layer 840 may be formed of the same material as bonding layer 540, and hence may have refractive index $n_4$. Bonding layer 840 has a minimum thickness 849 above microlens array 220. Minimum thickness 849 is subject to similar constraints and ranges as thickness 549 of bonding layer 540, FIG. 5. In an embodiment, dielectric layer 208 extends upward (in a direction opposite direction 298Z) to cover respective side surfaces of at least one of low-index layer 530, bonding layer 540, and cover glass 250.

Figure 9:
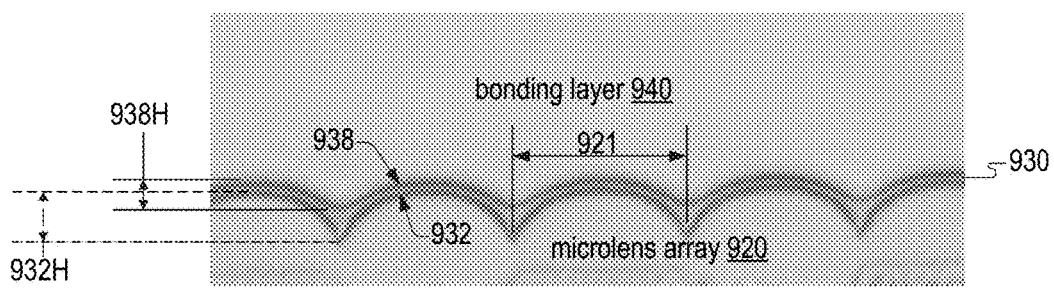
FIG. 9 is a scanning-electron microscope image of a sixth cavityless chip-scale image-sensor package, in an embodiment.

FIG. 9 is a scanning-electron microscope image of a low-index layer 930 between a microlens array 920 and a bonding layer 940. Low-index layer 930 is an example of low-index layers 730 and 830. Bonding layer 940 is an example bonding layer 540. Microlens array 620 is an example of microlens array 220. Low-index layer 930 includes surface regions 932 and 928, which are examples of surface regions 732 and 738, respectively. Surface region 938 has a peak-to-valley height 938H, which is less than a peak-to-valley height 932H of surface region 932.

Microlenses of microlens array have a diameter 921, which may range from one to twelve micrometers. For example, diameter 921 may be between 1.0 and 1.2 micrometers when bare image sensor 229 is part of a mobile device. Diameter 921 may be between eight and nine micrometers when bare image sensor 229 is a part of a full-frame camera. Peak-to-valley height 932H is, for example, between twenty-three and thirty-three percent of diameter 921. Peak-to-valley height 938H is, for example, between thirteen and twenty-three percent of diameter 921.

Figure 10:
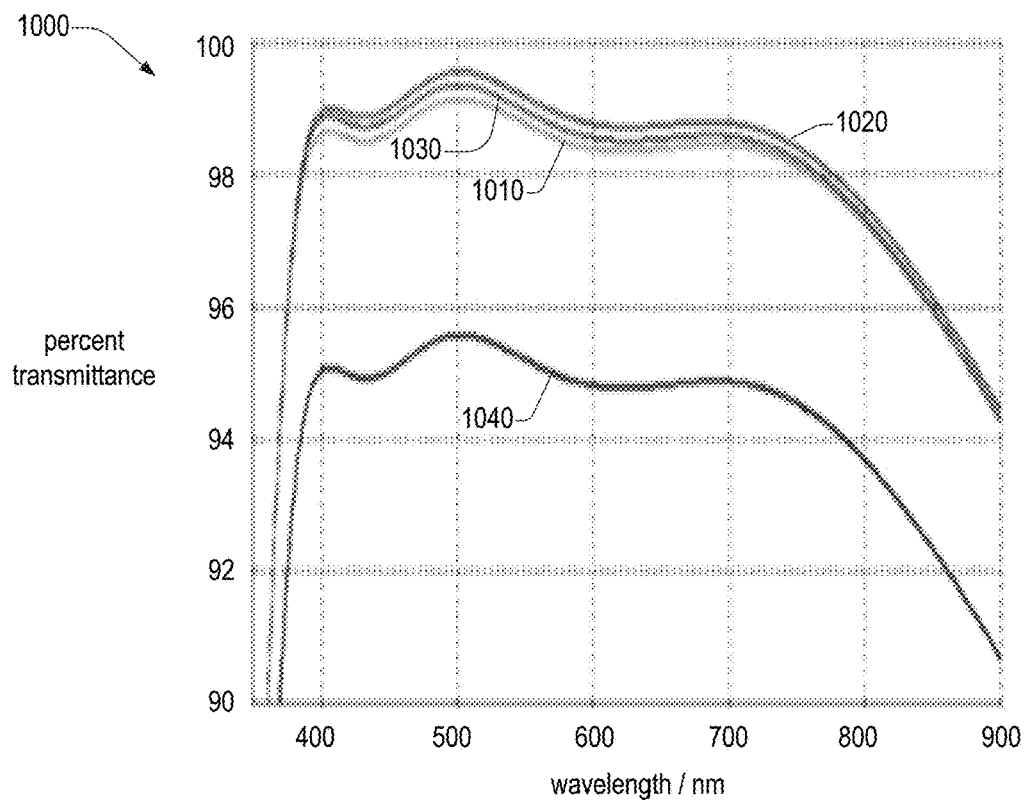
FIG. 10 is a graph illustrating visible-light transmittance of low-index layers used in embodiments of cavityless chip-scale image-sensor packages disclosed herein.

FIG. 10 is a graph 1000 illustrating visible-light transmittances 1010, 1020, and 1030, each of which represents a transmittance through a coverglass and a respective example of low-index layer 530 on a first side thereof. The coverglass is an example of cover glass 250 and has a multilayer antireflective coating on a second side opposite the first side. Visible-light transmittance 1010 corresponds a low-index layer having a thickness $t_{1010}$=109 nm and a refractive index $n_{1010}$=1.10 across the visible electromagnetic spectrum. Visible-light transmittance 1020 corresponds a low-index layer having a thickness $t_{1020}$=105 nm and a refractive index $n_{1020}$ between 1.20 and 1.25 across the visible electromagnetic spectrum. Visible-light transmittance 1030 corresponds to a low-index layer having a thickness $t_{1030}$=97 nm and a refractive index $n_{1030}$=1.30 across the visible electromagnetic spectrum. Each of the aforementioned thicknesses is an example of minimum thickness 437 of low-index layer 430 (FIG. 4).

The transmittances 1010, 1020, and 1030 correspond to quarter-wave-thickness optical coatings with design wavelengths between 480 nm and 525 nm. A low-index layer 530 may have a refractive index and thickness such that its optical thickness is equal to a visible electromagnetic wavelength, for example, a wavelength between 480 nm and 525 nm.

Graph 1000 also includes a visible-light transmittance 1040, which is the transmittance of the cover glass with the multilayer coating but without a low-index layer on the first side. The multilayer antireflective coating is a six-layer coating that includes three alternating pairs of tantalum pentoxide and silicon dioxide layers. The layer thicknesses t(i) are: t(1–6)=18.49, 28.45, 79.36, 6.75, 41.91, and 91.66 nanometers, where odd layers (i is odd) are formed of tantalum pentoxide and even layers (i is even) are formed of silicon dioxide. The first layer (i=1) is directly on the second side of the cover glass.

Figure 11:
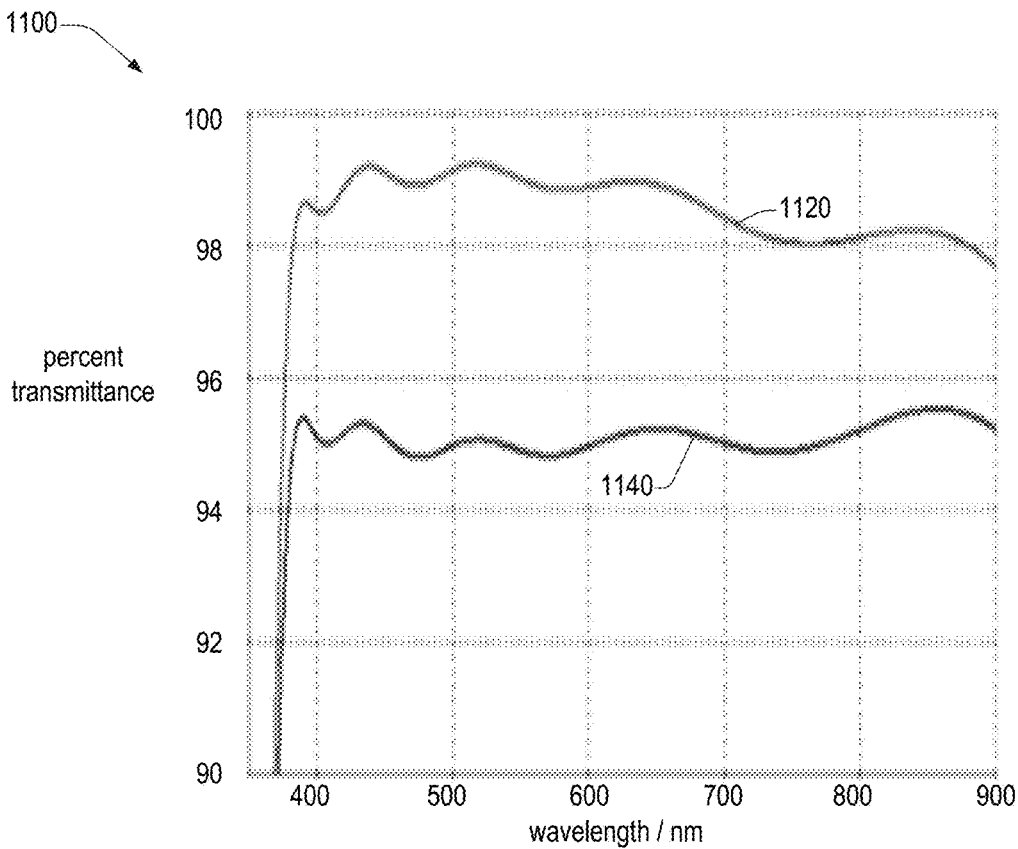
FIG. 11 is a graph illustrating visible-light transmittance of a low-index layer on a first side of a cover glass, in an embodiment.

FIG. 11 is a graph 1100 illustrating visible-light transmittance 1120 through a cover glass and a low-index layer on a first side thereof. The coverglass is an example of cover glass 250 and has a multilayer antireflective coating on a second side opposite the first side. Visible-light transmittance 1020 corresponds a low-index layer that is 105-nm thick and has refractive index $n_{1020}$.

Graph 1100 also includes a visible-light transmittance 1140, which is the transmittance of the cover glass with the multilayer coating but without a low-index layer on the first side. The multilayer antireflective coating is a ten-layer coating that includes five alternating pairs of tantalum pentoxide and silicon dioxide layers. The layer thicknesses t(i) are: t(1-10)=8.32, 64.64, 10.45, 230.21, 20.94, 31.17, 83.2, 11.22, 38.28, and 97.16 nanometers, where odd layers (layer index i is an odd integer) are formed of tantalum pentoxide and even layers (layer index i is an even integer) are formed of silicon dioxide. The first layer (i=1) is directly on the second side of the cover glass.

Figure 12:
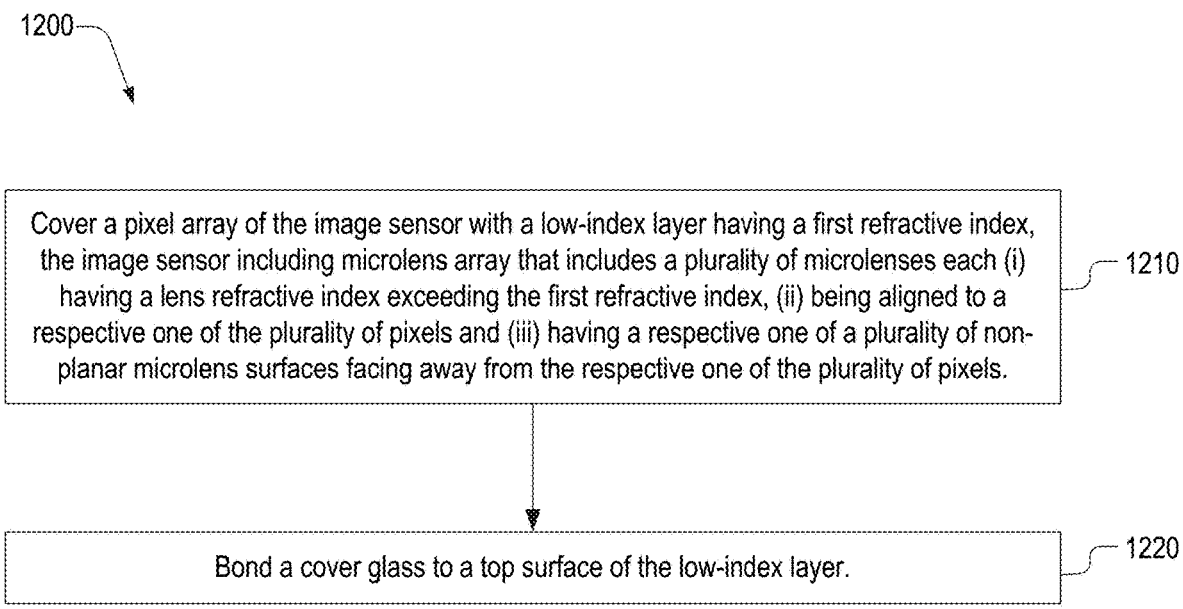
FIG. 12 is a flowchart illustrating a method for encapsulating an image sensor, in an embodiment.

FIG. 12 is a flowchart illustrating a method 1200 for encapsulating an image sensor. Method 1200 includes at least one of steps 1210 and 1220. Step 1210 includes covering a pixel array of the image sensor with a low-index layer having a first refractive index. The image sensor includes a microlens array that includes a plurality of microlenses each (i) being aligned to a respective one of the plurality of pixels and (ii) having a respective one of a plurality of non-planar microlens surfaces facing away from the respective one of the plurality of pixels. Step 1210 results in a bottom surface of the low-index layer being conformal to each of the plurality of non-planar microlens surfaces. In step 1210, the low-index layer may be formed via an oblique-angle deposition process, a spin-coating process, a spray-coating process, or a combination thereof. Step 1210 may be a wafer-level process, such that each pixel array of a plurality of image sensors of a device wafer are coated with the low-index layer in a same process step.

In a first example of step 1210, low-index layer 430 (FIG. 4) is deposited on bare image sensor 229 above pixel array 214 to cover microlens array 220. In a second example of step 1210, low-index layer 730 (FIG. 7) is deposited on bare image sensor 229 above pixel array 214 to cover microlens array 220.

Step 1210 may include covering a bond pad located on a substrate in which, or upon which, the image sensor is formed. For example, step 1210 may include covering bond pad 205 with either low-index layer 430 or low-index layer 730.

Step 1220 includes bonding a cover glass to a top surface of the low-index layer, the top surface being opposite the bottom surface. In a first example of step 1220, cover glass 250 is bonded to low-index layer 530 by means of bonding layer 540, FIG. 5. In a second example of step 1220, cover glass 250 is bonded to low-index layer 830 by means of bonding layer 840, FIG. 8.

Combinations of Features

Features described above as well as those claimed below may be combined in various ways without departing from the scope hereof. The following examples illustrate some possible, non-limiting combinations:

(A1) denotes a cavityless chip-scale image-sensor package includes a substrate, a microlens array, and a low-index layer. The substrate includes a plurality of pixels forming a pixel array. The microlens array includes a plurality of microlenses each (i) having a lens refractive index, (ii) being aligned to a respective one of the plurality of pixels and (iii) having a non-planar microlens surface facing away from the respective one of the plurality of pixels. The low-index layer has a first refractive index less than the lens refractive index, and a bottom surface, at least part of which is conformal to each non-planar microlens surface, the microlens array being between the pixel array and the low-index layer.

(A2) In the cavityless chip-scale image-sensor package denoted by (A1), the first refractive index may be between 1.20 and 1.25.

(A3) In any cavityless chip-scale image-sensor package denoted by one of (A1) and (A2), thickness of the low-index layer, above an apex of one of the plurality of microlenses, may be between 95 nanometers and 115 nanometers.

(A4) In any cavityless chip-scale image-sensor package denoted by one of (A1) through (A3), the low-index layer may have, at a visible electromagnetic wavelength, a quarter-wave optical thickness above an apex of one of the plurality of microlenses.

(A5) In any cavityless chip-scale image-sensor package denoted by one of (A1) through (A4), the visible electromagnetic wavelength may be between 480 nanometers and 515 nanometers.

(A6) In any cavityless chip-scale image-sensor package denoted by one of (A1) through (A5), the lens refractive index may exceed the first refractive index by at least $\Delta n=0.20$ for a range of visible electromagnetic wavelengths.

(A7) In any cavityless chip-scale image-sensor package denoted by one of (A1) through (A6), the low-index layer may have a planar top surface opposite the bottom surface.

(A8) In any cavityless chip-scale image-sensor package denoted by one of (A1) through (A6), the low-index layer may have, opposite the bottom surface, a non-planar top surface that is conformal to the bottom surface.

(A9) In any cavityless chip-scale image-sensor package denoted by one of (A1) through (A8), the bottom surface of the low-index layer may adjoin the plurality of non-planar microlens surfaces (A10) In any cavityless chip-scale image-sensor package denoted by one of (A1) through (A9), when the pixel array is configured to detect light incident on a top die-surface of the substrate, the top die-surface may include a bond pad adjacent to the pixel array and beneath the low-index layer.

(A11) In any cavityless chip-scale image-sensor package denoted by one of (A1) through (A10), the low-index layer may be formed of a nanoporous material.

(A12) In any cavityless chip-scale image-sensor package denoted by one of (A1) through (A11), the low-index layer may completely cover the microlens array.

(A13) Any cavityless chip-scale image-sensor package denoted by one of (A1) through (A12) may further include a bonding layer and a cover glass. The bonding layer adjoins the low-index layer such that the low-index layer is between the microlens array and the bonding layer. The cover glass is disposed on the bonding layer opposite the low-index layer. The bonding layer and the cover glass have, respectively, a second refractive index and a third refractive index respectively that each exceeds the first refractive index.

(A14) In any cavityless chip-scale image-sensor package denoted by (A13), when the pixel array is configured to detect light incident on a top die-surface of the substrate, the top die-surface may include a bond pad adjacent to the pixel array and beneath each of the low-index layer, the bonding layer, and the cover glass.

(A15) In any cavityless chip-scale image-sensor package denoted by one of (A13) and (A14), the lens refractive index, the second refractive index, and the third refractive index may be equal to within $\Delta n=0.08$ for a range of visible electromagnetic wavelengths.

(A16) In any cavityless chip-scale image-sensor package denoted by one of (A13) through (A15), the lens refractive index, the second refractive index, and the third refractive index may be in the range from 1.46 to 1.54 for a range of visible electromagnetic wavelengths.

(A17) In any cavityless chip-scale image-sensor package denoted by one of (A13) through (A16), the bonding layer may have a coefficient of thermal expansion less than 200 ppm/K for a temperature range below a glass transition temperature of the plurality of microlenses (A18) In any cavityless chip-scale image-sensor package denoted by one of (A13) through (A17), the bonding layer may be between five micrometers and ten micrometers thick.

(B1) denotes a method for encapsulating an image sensor includes covering a pixel array of the image sensor with a low-index layer having a first refractive index. The image sensor includes a microlens array that includes a plurality of microlenses each (i) having a lens refractive index exceeding the first refractive index, (ii) being aligned to a respective one of the plurality of pixels, and (iii) having a non-planar microlens surface facing away from the respective one of the plurality of pixels.

(B2) In any method denoted by (B1), in which the low-index layer includes a top surface opposite the bottom surface, the method may further include bonding a cover glass to the top surface.

Changes may be made in the above methods and systems without departing from the scope hereof. It should thus be noted that the matter contained in the above description or shown in the accompanying drawings should be interpreted as illustrative and not in a limiting sense. Herein, and unless otherwise indicated, the adjective "exemplary" means serving as an example, instance, or illustration. The following claims are intended to cover all generic and specific features described herein, as well as all statements of the scope of the present method and system, which, as a matter of language, might be said to fall therebetween.

What is claimed is:

1. A cavityless chip-scale image-sensor package comprising:
    a substrate that includes a plurality of pixels forming a pixel array;
    a microlens array that includes a plurality of microlenses each (i) having a lens refractive index, (ii) being aligned to a respective one of the plurality of pixels, and (iii) having a non-planar microlens surface facing away from the respective one of the plurality of pixels;
    a low-index layer formed of either nanoporous silicon dioxide or nanoporous aluminum oxyhydroxide, and having (i) a first refractive index less than the lens refractive index, (ii) a bottom surface, at least part of which is conformal to each non-planar microlens surface, and (iii) a non-planar top surface that is conformal to the bottom surface and opposite the bottom surface, the microlens array being between the pixel array and the low-index layer; and
    a bonding layer adjoining the low-index layer such that the low-index layer is between the microlens array and the bonding layer; and
    a cover glass disposed on the bonding layer opposite the low-index layer,
    the bonding layer and the cover glass having a second refractive index and a third refractive index respectively, each exceeding the first refractive index.

2. The cavityless chip-scale image-sensor package of claim 1, the first refractive index being between 1.20 and 1.25.

3. The cavityless chip-scale image-sensor package of claim 1, thickness of the low-index layer above an apex of one of the plurality of microlenses being between 95 nanometers and 115 nanometers.

4. The cavityless chip-scale image-sensor package of claim 1, the low-index layer having, at a visible electromagnetic wavelength, a quarter-wave optical thickness above an apex of one of the plurality of microlenses.

5. The cavityless chip-scale image-sensor package of claim 4, the visible electromagnetic wavelength being between 480 nanometers and 515 nanometers.

6. The cavityless chip-scale image-sensor package of claim 1, the lens refractive index exceeding the first refractive index by at least $\Delta n=0.20$ for a range of visible electromagnetic wavelengths.

7. The cavityless chip-scale image-sensor package of claim 1, the bottom surface of the low-index layer adjoining each non-planar microlens surface.

8. The cavityless chip-scale image-sensor package of claim 1, the pixel array being configured to detect light incident on a top die-surface of the substrate, the top die-surface including a bond pad adjacent to the pixel array and beneath the low-index layer.

9. The cavityless chip-scale image-sensor package of claim 1, the low-index layer completely covering the microlens array.

10. The cavityless chip-scale image-sensor package of claim 1, the pixel array being configured to detect light incident on a top die-surface of the substrate, the top die-surface including a bond pad adjacent to the pixel array and beneath each of the low-index layer, the bonding layer, and the cover glass.

11. The cavityless chip-scale image-sensor package of claim 1, the lens refractive index, the second refractive index, and the third refractive index being equal to within $\Delta n=0.08$ for a range of visible electromagnetic wavelengths.

12. The cavityless chip-scale image-sensor package of claim 1, the lens refractive index, the second refractive index, and the third refractive index being in the range from 1.46 to 1.54 for a range of visible electromagnetic wavelengths.

13. The cavityless chip-scale image-sensor package of claim 1, the bonding layer having a coefficient of thermal expansion less than 200 ppm/K for a temperature range below a glass transition temperature of the plurality of microlenses.

14. The cavityless chip-scale image-sensor package of claim 1, the bonding layer being between five micrometers and ten micrometers thick.

15. The cavityless chip-scale image-sensor package of claim 1,
    a diameter of each of the plurality of microlenses being between eight micrometers and nine micrometers;
    a peak-to-valley height of the non-planar microlens surface being between thirteen percent and twenty-three percent of the diameter.

16. A cavityless chip-scale image-sensor package comprising:
    a substrate that includes a plurality of pixels forming a pixel array configured to detect light incident on a top die-surface of the substrate;

a microlens array that includes a plurality of microlenses each (i) having a lens refractive index, (ii) being aligned to a respective one of the plurality of pixels, and (iii) having a non-planar microlens surface facing away from the respective one of the plurality of pixels;

a low-index layer having (i) a first refractive index less than the lens refractive index, (ii) a bottom surface, at least part of which is conformal to each non-planar microlens surface, and (iii) a non-planar top surface that is conformal to the bottom surface and opposite the bottom surface, the microlens array being between the pixel array and the low-index layer; and a bonding layer adjoining the low-index layer such that the low-index layer is between the microlens array and the bonding layer;

a cover glass disposed on the bonding layer opposite the low-index layer; and a bond pad adjacent to the pixel array and beneath the low-index layer, the bonding layer and the cover glass having a second refractive index and a third refractive index respectively, each exceeding the first refractive index.

\* \* \* \* \*